United States Patent
Diaz et al.

(10) Patent No.: US 6,813,154 B2
(45) Date of Patent: Nov. 2, 2004

(54) REVERSIBLE HEAT SINK PACKAGING ASSEMBLY FOR AN INTEGRATED CIRCUIT

(75) Inventors: Jose Diaz, Pembroke Pines, FL (US); Harold M. Cook, Boynton Beach, FL (US); Edmund B. Boucher, Fort Lauderdale, FL (US)

(73) Assignee: Motorola, Inc., Schaumburg, IL (US)

( * ) Notice: Subject to any disclaimer, the term of this patent is extended or adjusted under 35 U.S.C. 154(b) by 134 days.

(21) Appl. No.: 10/315,702

(22) Filed: Dec. 10, 2002

(65) Prior Publication Data

US 2004/0109292 A1 Jun. 10, 2004

(51) Int. Cl.$^7$ .................................................. H05K 7/20
(52) U.S. Cl. ..................... 361/704; 165/80.2; 165/80.3; 165/185; 174/16.3; 174/52.2; 257/707; 257/713; 257/678; 257/690; 257/698; 361/707; 361/717; 361/718; 361/722; 361/761; 361/764; 361/768; 361/774; 361/777
(58) Field of Search ............................. 165/80.2, 80.3, 165/185; 174/16.3, 52.1, 52.2, 252; 257/706–707, 712–713, 690, 679, 680, 686, 796, 678, 777–778, 698; 361/704–722, 760–777

(56) References Cited

U.S. PATENT DOCUMENTS

| | | | |
|---|---|---|---|
| 5,012,386 A | * | 4/1991 | McShane et al. ........... 361/715 |
| 5,287,247 A | * | 2/1994 | Smits et al. ................ 361/707 |
| 5,365,402 A | * | 11/1994 | Hatada et al. ............. 361/699 |
| 5,379,185 A | | 1/1995 | Griffin et al. |
| 5,557,502 A | * | 9/1996 | Banerjee et al. ........... 361/712 |
| 5,578,796 A | * | 11/1996 | Bhatt et al. ................ 174/260 |

* cited by examiner

*Primary Examiner*—Gregory D. Thompson
(74) *Attorney, Agent, or Firm*—Barbara R. Doutre

(57) ABSTRACT

A reversible heat sink packaging assembly (400) for integrated circuits is provided. The packaging assembly (400) includes a chip carrier (102) having an opening (104) formed therein and a heat sink (302). The heat sink (302) is attached to one side of a die (304). The die (304) fits into the opening (104) of the carrier (102) with the heat sink (302) abutting one side (208) of the carrier and the die being wire bonded (402) to the other side (108) of the carrier. The packaging assembly (400) can be oriented either device side up or down.

11 Claims, 2 Drawing Sheets

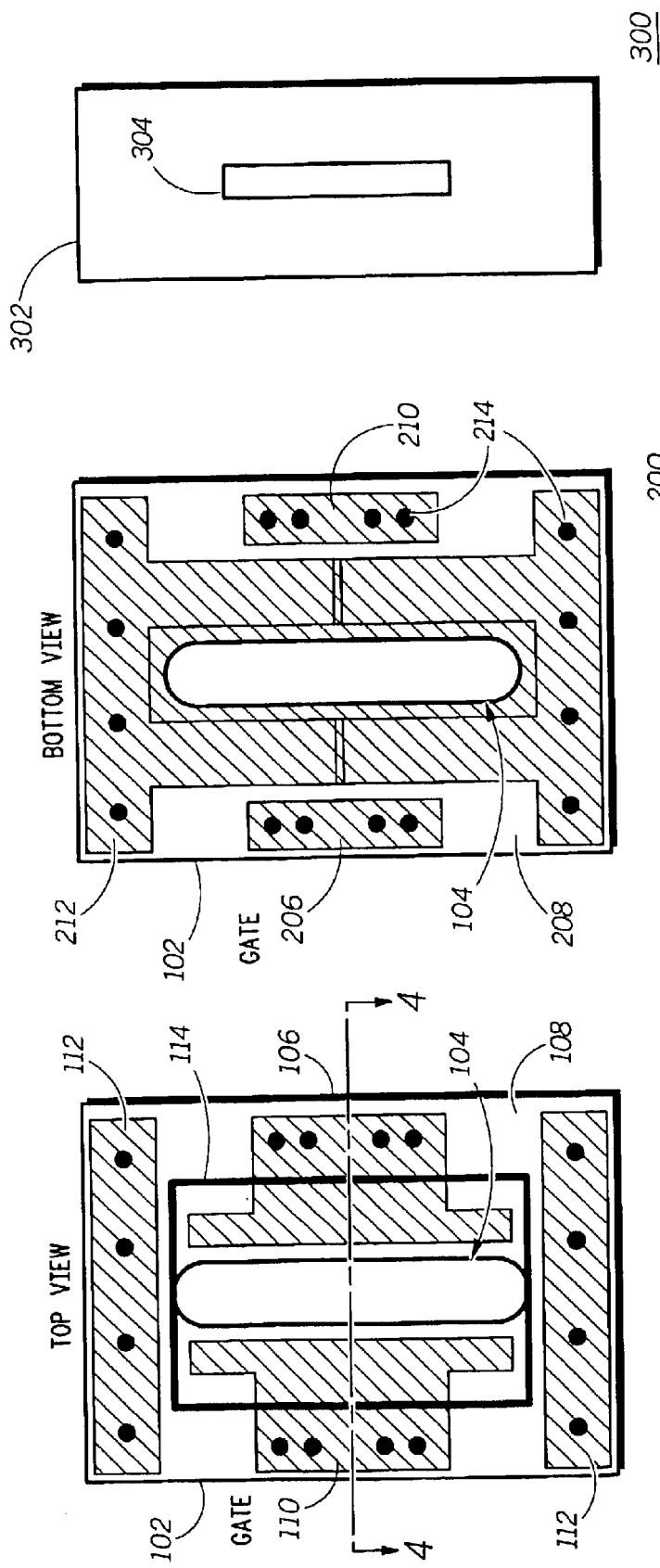

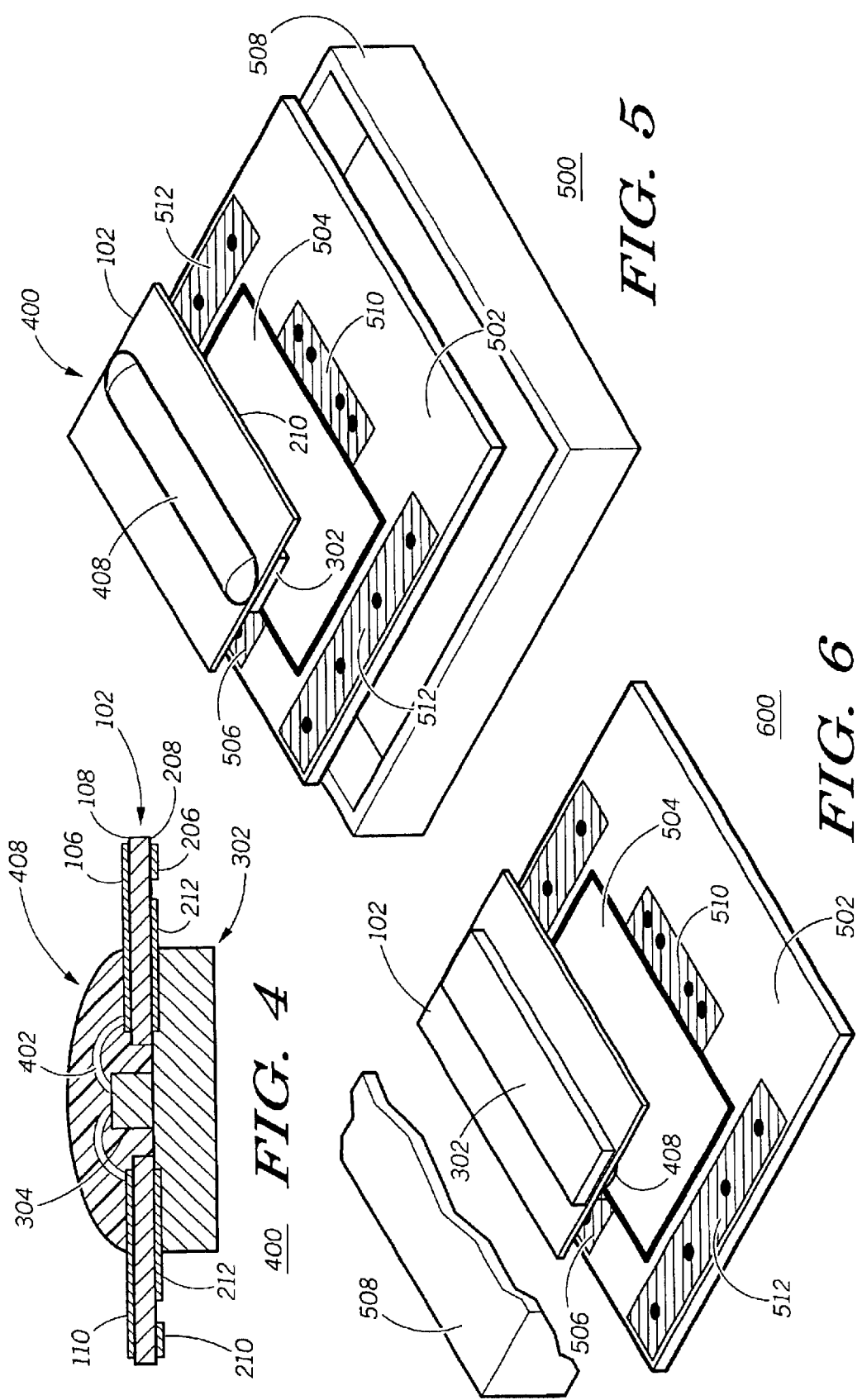

US 6,813,154 B2

REVERSIBLE HEAT SINK PACKAGING ASSEMBLY FOR AN INTEGRATED CIRCUIT

TECHNICAL FIELD

This invention relates in general to heat sinking systems and more particularly to heat sinking packaging systems for integrated circuits.

BACKGROUND

High power communication transmitters require a heat sinking system that efficiently removes and disperses heat away from the active devices in the circuit. Current manufacturing systems typically require that active devices be contained in a package which is conducive to automated placement and handsfree solder attachment. Thus, several parameters including design flexibility, minimum parts count, efficiency, cost, and ease of fabrication are all taken into consideration when designing high power active device packages.

Leadless surface mount packages requiring direct contact to a chassis from one side a circuit board exist today. However, accurate orientation of these packages is still required. Also, existing power packages often require expensive tooling and injection molding equipment.

Accordingly, it would be beneficial to have an improved package for heat sinking integrated active devices.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

FIG. 1 is a top view of a chip carrier portion of a packaging assembly in accordance with the present invention;

FIG. 2 is a bottom view of the chip carrier portion of FIG. 1 in accordance with the present invention;

FIG. 3 is a heat sink and die portion for the packaging assembly in accordance with the present invention;

FIG. 4 is a cross sectional side view of the packaging assembly formed in accordance with the present invention;

FIG. 5 is an isometric view of the packaging assembly of the present invention being inserted into a circuit board; and FIG. 6 is an isometric view of an alternative orientation for the packaging assembly of the present invention.

DETAILED DESCRIPTION OF THE PREFERRED EMBODIMENT

While the specification concludes with claims defining the features of the invention that are regarded as novel, it is believed that the invention will be better understood from a consideration of the following description in conjunction with the drawing figures, in which like reference numerals are carried forward.

In accordance with the present invention, there will be described herein a packaging assembly for a die, such as an active electronic device, which provides a leadless, surface mountable form that allows for direct contact to a chassis surface for heat sinking. Increased design flexibility is provided by the fact that the packaging assembly is reversible. Briefly, the packaging assembly includes a chip carrier and heat sink formed and assembled in accordance with the present invention as will be described with reference to FIGS. 1–6. FIGS. 1–3 show the individual piece parts prior to assembly while FIGS. 4–6 show various views of the packaged assembly.

FIG. 1 is a top view 100 of a chip carrier 102 formed in accordance with the present invention. Chip carrier 102 includes an aperture 104 formed therein. Formed on a top surface 108 of chip carrier 102 are first and second electrical contacts 106, 110 as well as ground contacts 112. Electrical contacts 106, 110 may be, for example, drain and gate contacts for a transistor. Chip carrier 102 can be formed of any substrate used in the electronic industry, such as printed circuit board materials, ceramics, as well as a host of others. Resist material 114 may be included to contain encapsulant shown later.

FIG. 2 is a bottom view 200 the chip carrier 102 of FIG. 1 formed in accordance with the present invention. Bottom surface 208 includes third and fourth contacts 206, 210 that electrically couple to corresponding first and second contacts 106, 110 on the top surface 108. A bottom ground plane 212 surrounds the aperture 104 and electrically couples to the ground contacts 112 on the top surface 108. Via holes 214 provide an interconnect between corresponding contacts. The contact configuration 106/206 and 110/210 shown and described in FIGS. 1 and 2 can vary depending on the device the chip carrier 102 is to accommodate.

FIG. 3 is a heat sink and die portion for the packaging assembly in accordance with the present invention. A variety of materials such as gold plated cooper or a copper/invar/copper combination can be used as the heat sink material depending on the application. Die 304 is preferably an active device, such as a high power transistor, that may be attached to the heat sink 302 using solder, conductive epoxy, or other attachment means. The method used to affix device 304 to the heat sink 302 should take into account the differences in coefficients of thermal expansion of the heat sink material and the device.

Turning now to FIG. 4, there is shown a cross sectional side view of a packaging assembly 400 formed in accordance with the present invention. Packaging assembly 400 includes the various sub-assembly portions 100, 200, and 300 assembled as a single package in accordance with the present invention. Assembly 400 includes chip carrier 102 having top and bottom surfaces 108, 208 respectively with aperture 104 formed therethrough. First and second electrical contacts 106 and 110 are formed on the top surface 108 of the chip carrier 102. Third and fourth electrical contacts 206, 210 are formed on the bottom surface 208 of the chip carrier 102 with the third and fourth electrical contacts being coupled to the first and second electrical 106, 110 contacts respectively. Contacts 106/206 and 110/210 provide signal pads for the active device, such as drain and gate contacts for a transistor. Ground plane 212 is located on the bottom surface 208 of the chip carrier 102. The heat sink 302 is coupled to the active electrical device 304, with the active electrical device protruding through the aperture 104. The active electrical device 304 is wire bonded through wire bonds 402 to the first and second electrical contacts 106, 110 on the top surface 108 of the chip carrier 102. The drain and gate contacts 106, 110 are connected to contacts 206/210 on the opposite side of the assembly. The heat sink 302 is coupled to the ground plane 212 of the bottom surface 208, preferably using well-known reflow techniques. The active device 304 and chip carrier 102 can be attached to the heat sink using solder, conductive epoxy, or other appropriate attachment means. An encapsulant 408 is preferably used to cover and protect the wire bonds 402. The completed assembly 400 thereby provides surface mount capability through the top surface 108 through contacts 106, 110, 112 or the bottom surface 208 through corresponding contacts 206, 210, 212 on the bottom surface 208.

While the packaging assembly 400 has been described thus far in terms of an active device, such as a transistor having drain and gate contacts, the packaging assembly of the present invention can also be used for a variety of devices/circuits that require heat dissipation from the die. The chip carrier 102 of the present invention can be modified to accommodate a variety of footprints that interface with a plurality of electrical signals coming to and from the die 304. Thus, the chip carrier 102 of the present invention has an appropriately sized aperture 104 for receiving the die 304 and which allows the heat sink 302 to abut the carrier on one side while the footprint interfaces with the die signals on the other side.

Packaging assembly 400 of the present invention provides a heat sink side and a device side with electrical contact surface mount capability from either side. With the electrical signal on both sides of the chip carrier 102, package 400 can be reversed (i.e. flipped upside down). Since the heat sink 302 is at electrical ground, devices which can be used with the bottom of the die grounded will benefit greatly from this package. Circuit board designers can thus lay out a board to accommodate the package orientation which they wish to use.

FIGS. 5 and 6 reflect how the packaging assembly 400 of the present invention can be used in two different orientations providing design versatility. FIG. 5 is an isometric view 500 of the packaging assembly 400 of the present invention being inserted into a circuit board 502. Circuit board 502 can be, for example, a radio circuit board forming part of a radio communication device. A slot 504 is provided in the circuit board 502 to accommodate either the heat sink side or the device side of packaging assembly 400. In this embodiment, the packaging assembly 400 is being inserted via the heat sink side. Slot 504 receives the heat sink 302 therethrough and the electrical contacts 206/210/212 mate with corresponding circuit board contacts 506/510/512. The communication device provides a chassis 508, typically as part of a housing, onto which the heat sink 302 gets press fit to disperse the heat generated from the die. Thus, the heat sink can disperses heat from the packaging assembly 400 of the present invention to the chassis 508.

FIG. 6 is an isometric view 600 of an alternative orientation for the packaging assembly 400 of the present invention. As can be seen in FIG. 6, when the packaging assembly 400 of the present invention is flipped with the device side down, the circuit board slot 504 provides a cavity with which to receive the encapsulated wire bonds 408. In this orientation, chassis contact is made from the top by contacting the heat sink 302 to the chassis 508. Contacts 206, 210, 212 (not shown in this view) will mate with corresponding contacts 506, 508, 512, with the circuit board having been laid out for this orientation.

By providing the electrical contacts to both sides of a protruding chip carrier, the package 400 provided by the present invention is able to span and be soldered about a circuit board slot. The ground solder contacts 112, 212, seen in the top and bottom views 100, 200 (FIGS. 1 and 2) provide mechanical support and additional adhesion points so that the package 400 is not popped off the circuit board 502 when the heat sink contact is made from the opposite side of the circuit board.

In practice, the heat sink 302 and die encapsulant 408 are preferably formed of similar size so that both can fit into a circuit board slot 504. If heat sink contact is made from the top of the circuit board (as in FIG. 6), the encapsulant 408 is fit into the slot, and the heat sink is exposed for contact to the chassis. If the heat sink contact is made from the "bottom" (as in FIG. 5), the heat sink is placed in the slot and the encapsulant faces "up". The thickness of the heat sink 302 can be adjusted to protrude from the bottom of the circuit board 502 so as to allow contact to be made with the chassis. Alternatively, a pedestal can be designed into the casting of the chassis 508 to extend into the slot 504 to make thermal contact.

The packing assembly 400 of the present invention provides several improvements over existing packaging designs. Firstly, the reversibility benefit provides the ability to mount the assembly with the heat sink "up" or "down" and to make thermal contact with a chassis from either side of a circuit board. Secondly, the two-piece construction of the packaging assembly 400 is easy to manufacture. The two packaging pieces are the chip carrier 102 and the heat sink 302. These two pieces can be fabricated of very inexpensive materials, such a copper heat sink and a printed circuit board. This is in stark contrast to existing power packages which require expensive tooling and injection molding equipment. Since the two pieces of the package can be made from common materials and do not require expensive tooling, the size of the packaging assembly 400 can be adjusted to accommodate any die size.

Additionally, the packaging assembly of the present invention provides an extremely low profile device. Using a slot in a circuit board to accommodate the volume of the heat sink or the wire bonds creates an extremely low profile surface mount package. Thus, there has been provided a packaging assembly 400 that addresses the parameters considered in the design of such devices including design flexibility, simplified design, maximized heat sinking capability, low cost, and ease of fabrication.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A packaging assembly for a die, comprising:
   a chip carrier having top and bottom surfaces and an aperture formed therein, the die protruding through the aperture; and
   a heat sink coupled to the die and the bottom surface of the chip carrier, the die being wire bonded to the top surface of the chip carrier, the assembly thereby providing surface mount capability on either the top or bottom surface of the chip carrier.

2. A packaging assembly for a die as described in claim 1, further comprising encapsulant covering the die and wire bonds.

3. A packaging assembly for an active electrical device, comprising:
   a chip carrier having top and bottom surfaces with an aperture formed therethrough;
   first and second electrical contacts formed on the top surface of the chip carrier;
   third and fourth electrical contacts formed on the bottom surface of the chip carrier, the third and fourth electrical contacts being coupled to the first and second electrical contacts respectively;

ground contacts on the top surface of the chip carrier;

a ground plane on the bottom surface of the chip carrier;

a heat sink coupled to the active electrical device, the active electrical device protruding through the aperture and the active electrical device being wire bonded to the first and second electrical contacts on the top surface of the chip carrier, the heat sink coupling to the ground plane on the bottom surface of the chip carrier; and encapsulant covering the active device and wire bonds, the assembly thereby providing surface mount capability through the top surface or the bottom surface of the chip carrier.

4. A packaging assembly for a die, comprising:

a heat sink coupled to the die; and a chip carrier having an aperture formed therethrough for receiving the die such that the heat sink abuts one side of the chip carrier with the die protruding through the aperture, the die being wire bonded and coupled to electrical contacts on an opposite side of the chip carrier that mates with corresponding contacts on the one side thereby making the assembly surface mountable on either side of the chip carrier.

5. The packaging assembly of claim 4, further comprising encapsulant covering the die and wire bonds.

6. The packaging assembly of claim 4, wherein the die comprises an active electrical device.

7. A packaging assembly for an active electrical device, comprising:

a printed circuit board having top and bottom surfaces with an aperture formed therethrough;

first and second electrical contacts formed on the top surface of the chip carrier;

ground contacts on the top surface of the chip carrier;

a ground plane on the bottom surface of the chip carrier coupled to the ground contacts of the top surface;

third and fourth electrical contacts formed on the bottom surface of the chip carrier, the third and fourth electrical contacts being coupled to the first and second electrical contacts respectively;

a metal heat sink coupled to the active electrical device, the active electrical device protruding through the aperture and the active electrical device being wire bonded to the first and second electrical contacts on the top surface of the chip carrier, the metal heat sink coupling to the ground plane on the bottom surface of the chip carrier, encapsulant covering the active device and wire bonds, the assembly thereby providing surface mount capability through the top surface or the bottom surface of the chip carrier.

8. The packaging assembly of claim 7, wherein the active device comprises a transistor.

9. The packaging assembly of claim 8, wherein the first and second electrical contacts are drain and gate contacts.

10. A communication device, comprising:

a circuit board having a slot formed therein;

a housing within which the circuit board mounts;

an electronic device coupled to the circuit board, the electronic device being formed of a packaging assembly comprising:

a die;

a heat sink coupled to the die;

a chip carrier having an opening formed therein for receiving the die, the die being wire bonded to the chip carrier thereby forming a device side to the packaging assembly, the heat sink abutting the chip carrier thereby forming a heat sink side to the packaging assembly; and and the slot of the circuit board receiving either the device side or the heat sink side of the packaging assembly.

11. The communication device of claim 10, wherein the heat sink couples to the housing of the communication device.

* * * * *